(12) United States Patent
Lee et al.

(10) Patent No.: US 6,913,976 B2
(45) Date of Patent: Jul. 5, 2005

(54) METHOD OF MANUFACTURING SEMICONDUCTOR DEVICE

(75) Inventors: Seung Cheol Lee, Ichon-Shi (KR); Sang Wook Park, Seoul (KR)

(73) Assignee: Hynix Semiconductor Inc., Kyungki-Do (KR)

(*) Notice: Subject to any disclaimer, the term of this patent is extended or adjusted under 35 U.S.C. 154(b) by 0 days.

(21) Appl. No.: 10/659,814

(22) Filed: Sep. 11, 2003

(65) Prior Publication Data

US 2004/0127005 A1 Jul. 1, 2004

(30) Foreign Application Priority Data

Dec. 27, 2002 (KR) ................................. 10-2002-0085509

(51) Int. Cl.[7] .............................................. H10L 21/336
(52) U.S. Cl. ..................... 438/264; 438/201; 438/257; 438/308; 438/530; 438/663; 438/696; 438/706; 438/798
(58) Field of Search ................................ 438/201, 211, 438/257, 264, 308, 513, 530, 593, 594, 663, 669, 696, 706, 798, FOR 187, FOR 203, FOR 388, FOR 408

(56) References Cited

U.S. PATENT DOCUMENTS 6,121,138 A * 9/2000 Wieczorek et al. ......... 438/682
6,147,014 A * 11/2000 Lyding et al. ............... 438/798
6,444,533 B1 * 9/2002 Lyding et al. ............... 438/308
2004/0014285 A1 * 1/2004 Lee et al. .................... 438/258

FOREIGN PATENT DOCUMENTS

KR    10-0219416 B1    6/1999

OTHER PUBLICATIONS

Office Action issued by Korean Intellectual Property Office dated Sep. 30, 2004.

* cited by examiner

*Primary Examiner*—George Fourson
*Assistant Examiner*—Joannie Adelle Garcia
(74) *Attorney, Agent, or Firm*—Marshall, Gerstein & Borun LLP

(57) ABSTRACT

Disclosed is a method of manufacturing the semiconductor devices. The method comprising the steps of forming a gate electrode on a semiconductor substrate, depositing an oxide film for a spacer on the gate electrode, implementing an anisotropic dry etch process for the oxide film for the spacer to form spacers at the sidewalls of the gate electrode, and implementing a rapid thermal annealing process for the spacers under an oxygen atmosphere in order to segregate hydrogen contained within the spacers toward the surface. Therefore, hydrogen contained within the spacer oxide film is not diffused into the tunnel oxide film and the film quality of the tunnel oxide film is thus improved. As a result, program or erase operation characteristics of the flash memory device and a retention characteristic of the flash memory device could be improved.

6 Claims, 3 Drawing Sheets

METHOD OF MANUFACTURING SEMICONDUCTOR DEVICE

BACKGROUND OF THE INVENTION

1. Field of the Invention

The present invention relates to a method of manufacturing semiconductor devices, and more particularly, a method of manufacturing semiconductor devices capable of prohibiting charge loss within a tunnel oxide film and improving a retention characteristic of the flash memory device, by prohibiting a phenomenon that hydrogen contained in a spacer oxide film is inter-diffused into the tunnel oxide film.

2. Background of the Related Art

A retention characteristic in the flash memory device has great influence on reliability characteristic of the device. A material for use in the spacer in the flash memory device includes high temperature oxide (HTO) using $SiH_2Cl_2$ (dichlorosilane; DCS) and a $Si_2H_2Cl_2$ gas is used as a source gas. Thus, hydrogen exists within the spacer. In other words, hydrogen is trapped within the spacer oxide film according to the following [Reactive Equation 1].

$SiH_2Cl_2(DCS)+O_2 \rightarrow SiO_2+H_2+Cl$  [Reactive Equation 1]

Also, as annealing is implemented within the furnace for a long period of time, hydrogen can be easily inter-diffused. In other words, as high temperature oxide (HTO) using $SiH_2Cl_2$ (DCS) is used as the material for the spacer, hydrogen contained in the $Si_2H_2Cl_2$ gas is contained within the spacer oxide film. Thereafter, as the high temperature annealing process proceeds, hydrogen left within the spacer oxide film is inter-diffused into the tunnel oxide film. As such, hydrogen ion existing within the tunnel oxide film forms a Si—H bonding. In a program or erase operation, electrons are neutralized by the hydrogen ion. In the result, charge loss occurs. This charge loss results in degradation of the retention characteristic in the flash memory device.

SUMMARY OF THE INVENTION

Accordingly, the present invention is contrived to substantially obviate one or more problems due to limitations and disadvantages of the related art.

An object of the present invention is to provide a method of manufacturing semiconductor devices capable of prohibiting charge loss within a tunnel oxide film and improving a retention characteristic of the flash memory device, by prohibiting a phenomenon that hydrogen contained in a spacer oxide film is inter-diffused into the tunnel oxide film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, provide a method of manufacturing semiconductor devices according to the present invention is characterized in that it comprises the steps of forming a gate electrode on a semiconductor substrate, depositing an oxide film for a spacer on the gate electrode, implementing an anisotropic dry etch process for the oxide film for the spacer to form spacers at the sidewalls of the gate electrode, and implementing a rapid thermal annealing process for the spacers under an oxygen atmosphere in order to segregate hydrogen contained within the spacers toward the surface.

The oxide film for the spacer may be a high temperature oxide (HTO) film using $SiH_2Cl_2$ (dichlorosilane). It is preferred that the oxide film for the spacer is deposited in thickness of 400~1000 Å at a temperature of 680~730° C.

It is preferable that the rapid thermal annealing is implemented at a temperature of 750~1050° C. under an oxygen atmosphere. It is also preferable that the rapid thermal annealing is implemented by ramping up the temperature up to the annealing temperature at the rate of 5° C./sec and introducing oxygen at the flow of about 3~15 SLM.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
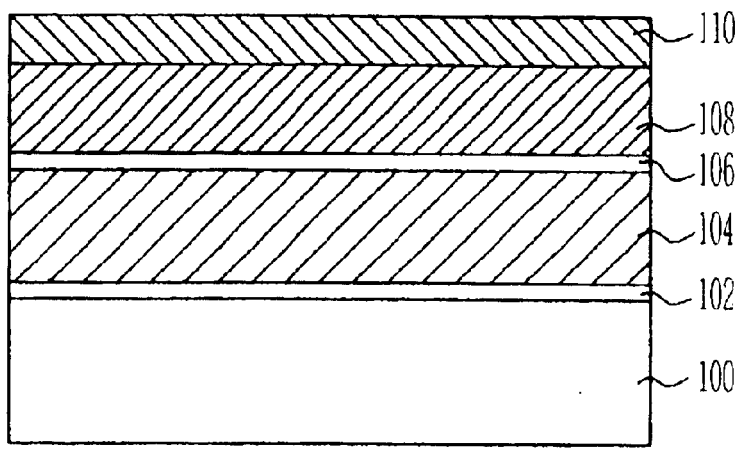
FIG. 1~FIG. 6 are cross-sectional views of semiconductor devices for explaining a method of manufacturing the device according to a preferred embodiment of the present invention.

Reference will now be made in detail to the preferred embodiments of the present invention, examples of which are illustrated in the accompanying drawings, in which like reference numerals are used to identify the same or similar parts. If it is described in the following description that one layer exists on the other layer, this means that one layer may exist immediately on the other layer and a third layer may be intervened between the two layers. Furthermore, the thickness and dimension of each of layers in the drawings are exaggerated for convenience of explanation and clarity.

FIG. 1~FIG. 6 are cross-sectional views of semiconductor devices for explaining a method of manufacturing the device according to a preferred embodiment of the present invention.

Referring to FIG. 1, a tunnel oxide film 102 is formed on a semiconductor substrate 100 in which an isolation film (not shown) is formed. A first polysilicon film 104 to be used as a floating gate is then formed on the tunnel oxide film 102. In the above, it is preferred that the tunnel oxide film 102 is formed in thickness of about 60~100 Å at a temperature of about 750° C.~900° C. For example, the tunnel oxide film 102 may be formed by performing a wet oxidization process at a temperature of about 750° C.~900° C. and then performing annealing at a temperature of about 900° C.~910° C. under a nitrogen ($N_2$) atmosphere for 20~30 minutes. Furthermore, the first polysilicon film 104 may be formed in thickness of about 700~2000 Å at a temperature of about 530~610° C. and a low pressure of about 0.1~13 Torr by means of a LP-CVD (low pressure-chemical vapor deposition) method using $SiH_4$ or $Si_2H_6$ an $PH_3$ gas.

Next, a dielectric film 106 is formed on the first polysilicon film 104. The dielectric film 106 may be formed using an ONO insulating film, i.e., an insulating film of a structure on which an oxide film, a silicon nitride film and an oxide film are sequentially stacked. The oxide film of the dielectric film 106 may be formed using high temperature oxide (HTO) using $SiH_2Cl_2$ (dichlorosilane; DCS) and $H_2O$ gas as a source gas. The nitride film of the dielectric film 106 may be formed using $NH_3$ and $SiH_2Cl_2$ gas as a reaction gas at a low pressure of about 0.1~13 Torr and a temperature of about 650~800° C. by means of the LP-CVD method. It is preferred that the dielectric film 106 is formed in thickness of about 130~160 Å.

A second polysilicon film 108 to be used as a control gate and a silicide film 110 are sequentially formed on the dielectric film 106. It is preferred that the second polysilicon film 108 is formed in thickness of about 500~1000 Å at a temperature of about 530° C.~610° C. and a pressure of about 0.2~0.5 Torr. At this time, a doped polysilicon film and an undoped amorphous silicon thin film may be used as the second polysilicon film 108. The silicide film 110 is formed in thickness of about 700~1500 Å using a tungsten silicon (WSi) film. The tungsten silicon (WSi) film being the silicide film 110 may be formed at a temperature between 390° C. and 430° C. and a pressure of about 0.2~0.5 Torr using a reaction of $SiH_4$ (monosilane; MS) or $SiH_2Cl_2$ (dichlorosilane; DCS) of about 2.9 sccm and $WF_6$ of about 3.4 sccm.

Figure 2:
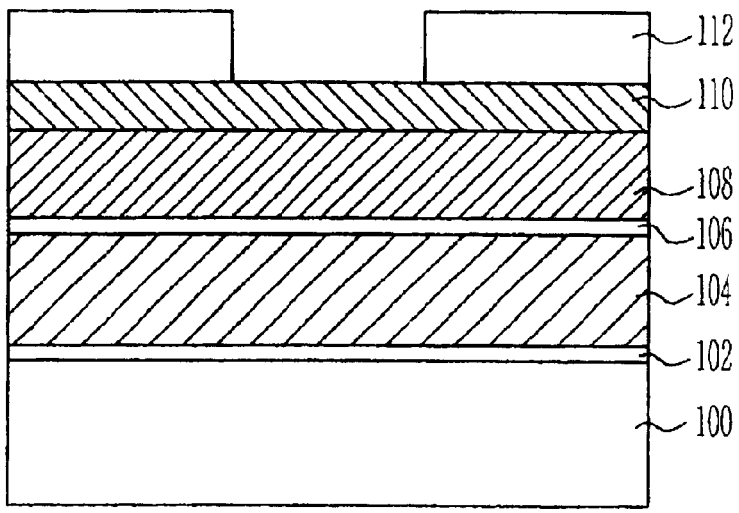
Figure 3:
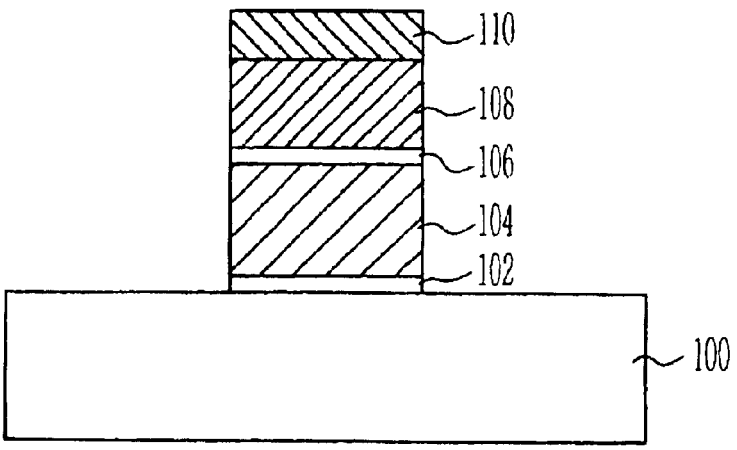

By reference to FIG. 2 and FIG. 3, a gate patterning process is implemented. In other words, the silicide film 110, the second polysilicon film 108, the dielectric film 106 and the first polysilicon film 104 are patterned using a mask 112 for forming the control gate.

Figure 4:
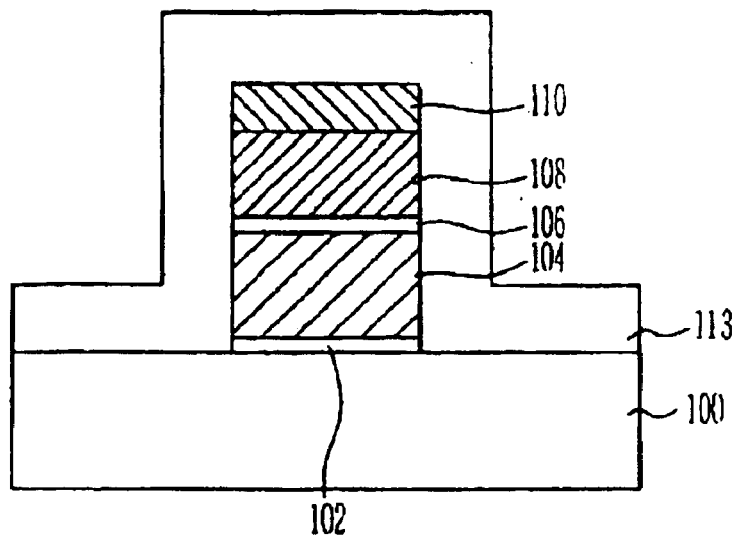

Turning to FIG. 4, an oxide film 113 for a spacer is deposited on the entire structure. It is preferable that a high temperature oxide (HTO) film using $SiH_2Cl_2$ (dichlorosilane; DCS) is used as the oxide film 113 for the spacer. Further, it is preferred that the oxide film 113 for the spacer is deposited in a thickness of about 400~1000 Å at a temperature of about 680~730° C.

Figure 5:
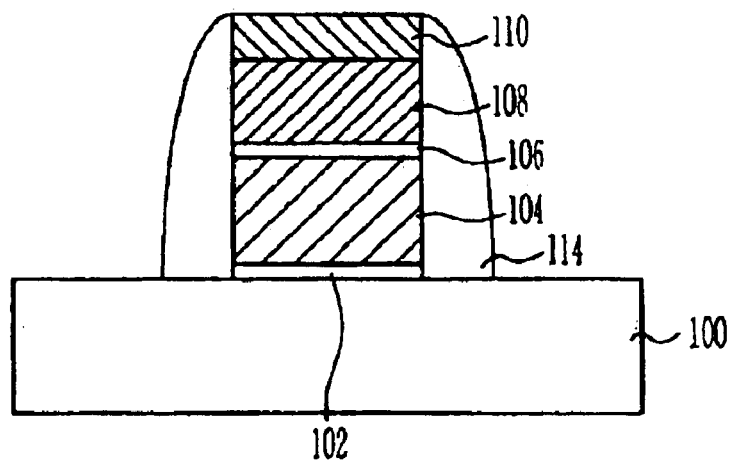

With reference to FIG. 5, spacers 114 are formed at the sidewalls of the gate electrode by means of an anisotropic dry etch process.

Figure 6:
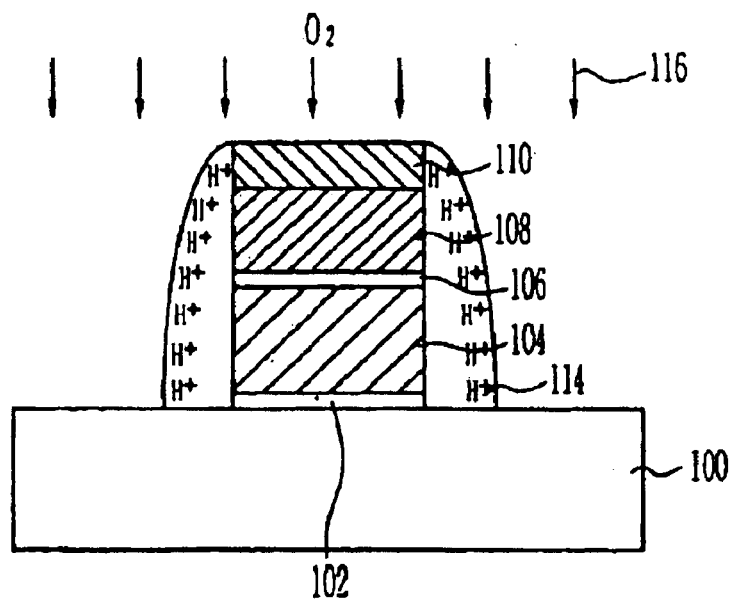

Referring to FIG. 6, in order to reduce hydrogen contained in the spacer oxide film 114, a rapid thermal process or a rapid thermal annealing 116 process is implemented under an oxygen atmosphere. The rapid thermal annealing 116 process proceeds at a temperature of about 750~1050° C. In the rapid thermal annealing process, the temperature is ramped up at the rate of about 5° C./sec up to the annealing temperature. At this time, in the rapid thermal annealing 116, oxygen is introduced at the flow of about 3~15 SLM. A H—O bonding is formed by the rapid thermal annealing 116 process and hydrogen ion is segregated from the surface of the spacer oxide film 114. As a result, hydrogen is outwardly diffused from the spacer oxide film 114. This is a phenomenon generated by an effect that hydrogen ion is gettered by the oxygen atmosphere. The gettering effect occurs when a H—Si bonding energy is 2.3 eV, a H—O bonding energy is 3.7 eV and a H—O bonding is stable from the viewpoint of thermochemistry. In other words, as the bonding energy of hydrogen and oxygen is larger than that of hydrogen and silicon, there occurs an effect that hydrogen is segregated from the surface. Since the bonding energy of hydrogen-oxygen is larger than that of hydrogen and silicon, a phenomenon that the hydrogen ion is segregated from the surface of the spacer oxide film occurs. As the hydrogen ions segregated on the surface is continuously experienced by annealing, they are outwardly diffused. Accordingly, as hydrogen is not contained within the spacer 114, a phenomenon that the hydrogen ion are diffused into the tunnel oxide film 102 does not occurs although subsequent annealing processes are performed. Due to this, as the film quality of the tunnel oxide film 102 is improved, a program or erase characteristic of the flash memory device and a retention characteristic could be improved.

Meanwhile, as the rapid thermal annealing 116 is implemented after the spacer oxide film 114 is formed, the gate sheet resistance (Rs) could be reduced. Also, as the rapid thermal annealing 116 has shorter process time than the furnace annealing, the grain growth of the silicide film 110 can be controlled.

Subsequent processes are same to common processes of the flash memory device. Therefore, explanation on them will be omitted for simplicity.

Although a specific embodiment of the flash memory device has been described in the above, those skilled in the art will appreciate that the present invention can be applied to the spacers formed at the sidewalls of the gate electrode such as DRAM.

Figure 7:
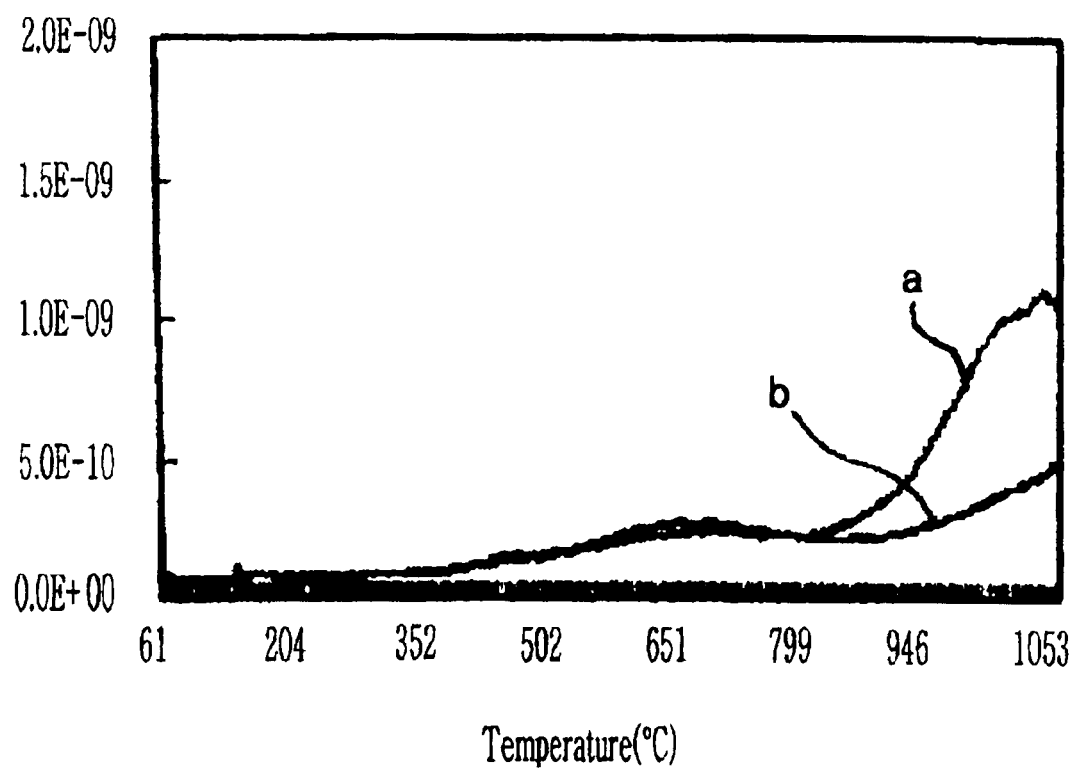
FIG. 7 is a graph showing the number of hydrogen ion within the spacer oxide film depending on temperature.

FIG. 7 is a graph showing the number of hydrogen ion within the spacer oxide film depending on temperature.

In FIG. 7, 'a' indicates the number of the hydrogen ion when the rapid thermal annealing process according to the present invention is not performed after the spacer oxide film is formed, and 'b' indicates the number of the hydrogen ion when the rapid thermal annealing process according to the present invention is performed after the spacer oxide film is formed.

From FIG. 7, it can be seen that the number of the hydrogen ion is abruptly reduced compared to when the rapid thermal annealing is not performed, if the rapid thermal annealing is implemented after the spacer oxide film is formed.

As described above, according to the present invention, after spacers are formed at the sidewalls of the gate electrode by use of the high temperature oxide (HTO) film using $SiH_2Cl_2$ (DCS), the rapid thermal annealing is implemented under the oxygen ($O_2$) atmosphere. Due to this, hydrogen existing within the spacer oxide film is gettered toward the surface of the spacer oxide film and hydrogen gettered on the surface is diffused toward the outside. Therefore, hydrogen contained within the spacer oxide film is not diffused into the tunnel oxide film and the film quality of the tunnel oxide film is thus improved. As a result, the present invention has new effects that it can improve program or erase operation characteristics of the flash memory device and thus improve a retention characteristic of the flash memory device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing semiconductor devices, comprising the steps of:

forming a gate electrode on a semiconductor substrate, the gate electrode having sidewalls;

depositing an oxide film for a spacer on the gate electrode;

implementing an anisotropic dry etch process for the oxide film for the spacer to form spacers at the sidewalls of the gate electrode; and implementing a rapid thermal annealing process for the spacers under an oxygen atmosphere in order to segregate hydrogen contained within the spacers toward the surface.

2. The method as claimed in claim 1, wherein the oxide film for the spacer is a high temperature oxide (HTO) film using $SiH_2Cl_2$ (dichlorosilane).

3. The method as claimed in claim 1, wherein the oxide film for the spacer is deposited in a thickness of 400~1000 Å at a temperature of 680~730° C.

4. The method as claimed in claim 1, wherein the rapid thermal annealing is implemented at a temperature of 750~1050° C. under an oxygen atmosphere.

5. The method as claimed in claim 1, wherein the rapid thermal annealing is implemented by ramping up the temperature up to the annealing temperature at a rate of 5° C./sec and introducing oxygen at a flow of about 3~15 SLM.

6. The method as claimed in claim 1, wherein the step of forming the gate electrode comprises the steps of:

forming a tunnel oxide film on the semiconductor substrate;

depositing a conductive film for a floating gate on the tunnel oxide film and patterning the conductive film to form the floating gate;

depositing a dielectric film and a conductive film for a control gate on the semiconductor substrate; and patterning the conductive film for the control gate, the dielectric film and the conductive film for the floating gate.

* * * * *